March 10, 1970 J. C. GREESON, JR 3,500,224

DIFFERENTIAL AMPLIFIER AND BIAS CIRCUIT ADAPTED
FOR MONOLITHIC FABRICATION

Filed Jan. 17, 1968

INVENTOR
JAMES C. GREESON, JR.

BY John C Black

ATTORNEY 3,500,224

DIFFERENTIAL AMPLIFIER AND BIAS CIRCUIT ADAPTED FOR MONOLITHIC FABRICATION

James C. Greeson, Jr., Woodstock, N.Y., assignor to International Business Machines Corporation, Armonk, N.Y., a corporation of New York Filed Jan. 17, 1968, Ser. No. 698,650
Int. Cl. H03f 3/68, 3/14
U.S. Cl. 330—30 11 Claims

ABSTRACT OF THE DISCLOSURE

The static operating D.C. (direct current) levels in a transistor differential amplifier are determined by first and second current sources for both emitter electrodes and one of the collector electrodes respectively. The first current source includes a transistor amplifier with one diode across its base-emitter electrodes. The second current source includes a transistor amplifier with two parallel diodes across its base-emitter electrodes. Each diode must be in the form of a transistor with its base-collector electrodes short-circuited and with its base-emitter voltage-current characteristics substantially matching those of its respective transistor amplifier; and the term "diode" as used hereinafter refers to such a transistor structure. A series resistor connects the one diode with the parallel diodes causing two units of current to flow in the one diode and its respective transistor amplifier and one unit of current to flow in each parallel diode and their respective transistor amplifier. With two units of current supplied to the emitter electrodes of the differential amplifier and one unit of current supplied to said one collector electrode of the differential amplifier, one unit of current will also flow in the other collector electrode of the differential amplifier.

BACKGROUND OF THE INVENTION

Field of the invention

The present application is particularly useful in the field of analog circuits, but is not to be so restricted. In a preferred embodiment, it is desired to provide small signal linear differential amplifiers which are characterized by a maximum dynamic range, a minimum number of resistors and a reliable control of D.C. static currents.

The improved circuit is particularly well adapted for construction on a single semiconductor chip by well-known monolithic techniques; and, in fact, to some extent relies upon monolithic fabrication for optimum low-cost implementation, i.e. low-cost transistors with matched characteristics are readily achieved in monolithically fabricated structures.

The improved amplifier permits minimum power supply levels which need not be accurately controlled and, therefore, minimizes the likelihood of transistor breakdown permitting maximum geometry freedom in the fabrication. A single integrated amplifier can be used with widely differing supply levels. Power dissipation is reduced permitting smaller, less expensive packages for mounting the circuits. Since the total number and value of the resistor elements is kept at a minimum, the semiconductor chip size for a given circuit can be reduced increasing the yield for a given wafer. Alternatively, the one or few resistors which are required can now be discrete elements removed from the chip without unduly increasing the number of semiconductor chip terminals required.

Description of the prior art

The amplifier of the present application makes use of the teachings of copending U.S. Patent application Ser. No. 513,395 of R. Ordower (Patent No. 3,392,342—July 9, 1968), filed Dec. 13, 1965, for a "Transistor Amplifier with Gain Stability," now U.S. Patent No. 3,392,342; and said copending application is hereby incorporated herein by reference. Said copending application teaches the use of one or more diodes in the form of transistors having their base-collector electrodes short-circuited and connected across the base-emitter electrodes of a transistor amplifier to control the current gain of the amplifier. The diodes and the transistor amplifier must have base-emitter voltage-current characteristics matched as perfectly as practical to provide a current gain in the collector electrode of the transistor amplifier (i.e. the ratio of the collector current to the diode current) which is an inverse function of the number of diodes connected across base-emitter electrodes of the transistor amplifier. For example, one diode provides a current gain of one, two diodes a gain of one-half, three diodes a gain of one-third, etc.

The amplifier of the present application makes use of this basic principle to effect further improvements in signal translating devices, in linear amplifiers and particularly in what are referred to commonly as operational amplifiers, e.g. of the type described in copending application of James C. Greeson, Jr. Ser. No. 491,962, filed Oct. 1, 1965, Patent No. 3,435,365 entitled "Monolithically Fabricated Operational Amplifier Device with Self Drive."

SUMMARY OF THE INVENTION

It is the primary object of the present invention to provide a differential amplifier with means including semiconductor devices and only one resistor (or other means for defining a current level) for setting the static D.C. levels, the ratios of the static D.C. currents in various portions of the circuit being maintained constant with relatively wide variations in voltage supply.

It is an important object of the present invention to provide an improved differential amplifier which is particularly well adapted for monolithic fabrication in a single semiconductor chip and which is characterized by minimum power dissipation, a minimum number of resistors and minimum total resistance, maximum input and output dynamic range and minimum voltage supply levels.

In one preferred form, the control of static operating D.C. levels in a transistor differential amplifier is determined by one voltage divider comprising a resistor and three diodes in the form of transistors having their base-collector electrodes short-circuited. The term "diode" as used hereinafter will refer to a transistor having its base-collector electrodes shorted. The emitter electrodes of the differential amplifier are connected in common to a first current source in the form of a transistor amplifier having a first diode of the type described connected across its base-emitter terminals to cause its collector current to be substantially equal to the current flowing through the first diode. A second current source is provided for one of the collector electrodes of the differential amplifier. The second source includes a transistor amplifier having a pair of parallel diodes across its base-emitter terminals, to cause its collector current to be substantially equal to the current in each parallel diode. In each instance, the voltage-current characteristics of the transistor amplifier and its associated diodes are matched as perfectly as practical.

The two parallel diodes, the resistor and the first diode form a voltage divider in which the two parallel diodes each pass one-half the current which flows through the resistor and the first diode. Consequently, the level of the current in the second current source is substantially equal to one-half the current in the first current source. This causes the static current in each collector electrode of the differential amplifier to equal half of the total emitter current of the differential amplifier.

In the above structure, it is essentially the resistor and the voltage supply which determine the levels of the currents. All of the resistor current flows through the first diode and half of the resistor current flows through each of the parallel diodes. Consequently, a current substantially equal to that flowing through the resistor also flows into the emitter electrode of the differential amplifier; and a current substantially equal to one-half of that flowing through the resistor also flows into said one collector electrode of the differential amplifier. The D.C. statio current flowing in the other collector electrode of the differential amplifier must, therefore, substantially equal one-half of the current flowing through the resistor.

A diode is connected in series with the other collector electrode of the differential amplifier to cause substantially equal power dissipations in the differential amplifier transistors, thereby improving accuracy.

An output stage is provided which includes first and second series-connected transistor amplifiers. The base electrode of the first series-connected amplifier is connected preferably to said one collector electrode of the differential amplifier; however, it can be connected to the other collector electrode for the opposite phase. The base-emitter electrodes of the second series-connected amplifier are connected across the first diode to supply constant current to the collector electrode of the first series-connected transistor at a level substantially equal to that flowing through the resistor.

Where greater power output is desired, a power output stage is provided which does not require any resistors. The static operating current level of the power output stage is determined by a transistor amplifier which has its base-emitter electrodes connected across said parallel diodes to supply current substantially equal to one-half the resistor current. This operating current is applied to a pair of series-connected diodes which in turn control the static operating current in an emitter follower driver. A diode is connected in the emiter circuit of the driver, and the series diodes are in parallel with the series circuit formed by the base-emitter of the driver and its diode. The power amplifier output stage also includes a Darlington pair which collects the static operating current from the series diodes and the driver. The input of the Darlington pair is connected to the current source transistor for the lower power output stage.

The structure comprising the pair of series diodes and the series driver and diode is shown and claimed per se in a copending application of James C. Greeson, Jr., Ser. No. 698,594, filed of even date herewith.

The foregoing and other objects, features and advantages of the invention will be apparent from the following more particular description of preferred embodiments of the invention, as illustrated in the accompanying drawings.

BRIEF DESCRIPTION OF THE PREFERRED EMBODIMENTS

Figure 1:
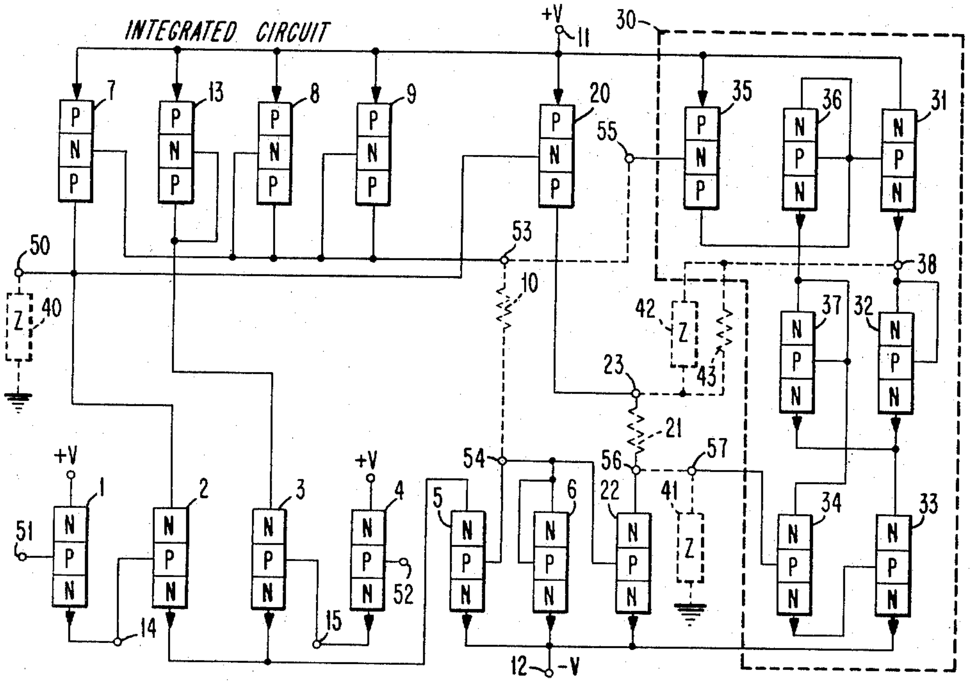
FIG. 1 is a schematic diagram of a preferred embodiment of the improved amplifier.

In the embodiment of FIG. 1, NPN transistors 1, 2 and 3, 4 are connected as a standard Darlington pair differential amplifier. The emitter electrodes of the transistors 2 and 3 are connected to a current source comprising a common emitter NPN transistor amplifier 5. An NPN diode 6 having its base-collector electrodes connected to the base of the amplifier 5 and having its emitter electrode connected to the emitter electrode of the amplifier 5 determines the current level which the amplifier 5 supplies to the emitter electrodes of the transistors 2 and 3.

The collector electrode of the transistor 2 is connected to a current source in the form of a PNP transistor amplifier 7. PNP diodes 8 and 9 are connected in parallel and have their emitter electrodes connected to the emitter electrode of the amplifier 7 and their base-collector electrodes connected to the base electrode of the amplifier 7. The collector current of the amplifier 7 is equal to the collector current in each of the diodes 8 and 9.

A resistor 10 is connected between the diode 6 and the diodes 8 and 9. The value of the resistor 10 and of the difference in the potential between the positive and negative supply terminals 11 and 12 essentially determines the value of current flowing through the diode 6 and resistor 10 and the parallel diodes 8 and 9. Since the diodes 8 and 9 are matched, they equally divide the current flowing through the resistor 10 and the diode 6.

The base-emitter voltage-current characteristics of the amplifier 7 and of the diodes 8 and 9 are equally matched; therefore, the collector current flowing from the amplifier 7 into the collector electrode of the transistor 2 is equal to one-half of the current flowing through the resistor 10 and the diode 6.

Since the base-emitter voltage-current characteristics of the amplifier 5 and the diode 6 are matched, the current supplied by the amplifier 5 to the emiter electrodes of the transistors 2 and 3 is equal to the current flowing through the resistor 10 and the diode 6.

The emitter and collector currents of the transistor 2 are substantially equal; and, therefore, each is equal to one-half of the total current supplied to the emitters of the transistors 2 and 3. Therefore, the emitter and collector currents of the transistor 3 will also be equal to one-half of the total current supplied to the emitter electrodes of the transistors 2 and 3 by the transistor amplifier 5. Thus the static operating currents of the transistors 2 and 3 are equal. This is the ideal condition for minimum amplifier offset.

The collector electrode of the transistor 3 is connected to a PNP diode 13 to offset the detrimental effect of the $H_{ob}$, i.e. the common base output conductance, of the transistor 3. Without the diode 13, the sum of the currents at terminals 14 and 15 can vary by as much as six hundred nanoamps. This difference in current results in the transistor 4 being biased at a lower level than the transistor 1, resulting in an offset voltage in the order of ten millivolts. However, when the diode 13 is interposed between the collector electrode of the transistor 3 and the positive supply terminal 11, the offset current is reduced to approximately twenty-five nanoamps which is in the thermal noise region.

The insertion of the diode 13 causes the average collector voltage of the transistor 3 to be substantially equal to that of the transistor 2, causing substantially equal power dissipations in the transistors 2 and 3.

Differential signals from the differential amplifier comprising the transistors 1–4 are applied from the collector electrode of the transistor 2 to the base electrode of a common emitter PNP transistor amplifier 20. The emitter electrode of the transistor 20 is connected to the positive supply terminal 11 and its collector electrode is connected by way of a resistor 21 to a constant current source in the form of an NPN transistor amplifier 22. The current level supplied by the amplifier 22 is equal to the current flowing through the resistor 10 and the diode 6, the diode 6 being connected across the base-emitter electrodes of the amplifier 22. The base-emitter voltage-current characteristics of the amplifier 22 and the diode 6 are matched.

Output signals can be derived from the terminal 23 which is connected to the collector electrode of the transistor amplifier 20. However, the differential amplifier together with the amplifier 20 form a conductance amplifier rather than a voltage amplifier, that is, an output current is available for a given differential input voltage.

In the event that greater output power is desired, the amplifiers 20 and 22 are connected to a power output stage 30. The stage 30 comprises an NPN transistor emitter follower amplifier 31 having its collector electrode connected to the positive supply terminal 11 and its emitter electrode connected by way of an NPN diode 32 to the collector electrode of one NPN transistor 33 of a Darlington pair also comprising an NPN transistor 34.

The static operating current levels for the amplifiers 31 and 33 are determined by a PNP transistor amplifier 35 having its base-emitter electrodes connected across the PNP diodes 8 and 9 to supply at its collector electrode a current equal to one-half of that flowing through the resistor 10 and the NPN diode 6. This one-half unit of current is applied to two NPN diodes 36 and 37 which are connected in series between the collector electrode of the transistor amplifier 35 and the collector electrode of the transistor 33.

The base-emitter voltage-current characteristics of the amplifier 35 and the diodes 8 and 9 are matched.

The diodes 36 and 37 are in parallel with the series circuit including the base-emitter electrodes of the transistor amplifier 31 and its associated diode 32. The base-emitter voltage-current characteristics of the amplifier 31 in the diodes 32, 36 and 37 are matched as closely as possible so that, in the idle condition of the amplifier, the collector current of the amplifier 31 is substantially equal to the current flowing through the diodes 36 and 37, that is, one-half unit of current. Assuming a high beta in the transistor 31, the emitter current thereof is substantially equal to the collector current. The one-half unit of current flowing through the diodes 36 and 37 and the one-half unit of current in the transistor 31 and its associated diode 32 flows into the collector electrode of the transistor 33. Thus the transistor 33 carries a static operating current of one unit.

When the amplifier of FIG. 1 is used in a conventional manner as an operational amplifier, impedances 40 and 41 are coupled between ground potential and the collector electrode of the transistor 2 and the collector electrode of the output amplifier 20, respectively. The impedances 40 and 41 determine the frequency and/or transient response characteristics of the amplifier.

Under conditions of normal operation as an amplifier, a voltage amplification is desired. In order to make the voltage gain of the improved amplifier independent of the load, a network including an impedance 42 and a parallel-connected resistor 43 can be connected between the power output terminal 38 and the lower power output terminal 23.

As has been indicated earlier, the improved amplifier of FIG. 1 is especially well adapted for fabrication on a single monolithic chip. Because of the improved current bias technique, it is now possible and preferred to fabricate only the semiconductor devices on the chip and to remove all of the impedance elements from the chip without unduly affecting the chip terminal requirements. In the embodiment illustrated in FIG. 1, connections to electrical apparatus external to the chip are made by way of terminals 11, 12, 14, 15, 23, 38 and 50–57 inclusive. It is assumed that each of the components shown in broken line is external to the chip, i.e. 10, 21, 40, 41, 42 and 43. As a result, the chip area for a given amplifier is reduced to a minimum, the area required for each of the semiconductor devices being small in comparison with the areas required for diffused resistors. It is also to be appreciated that the terminals 55 and 57 are required only in the event that the amplifier is fabricated for use alternatively with outputs from the terminal 23 or the terminal 38 for different applications.

The terminals 14 and 51 can be connected directly to each other and the terminals 15 and 52 connected directly to each other to improve the frequency response and the voltage gain at a sacrifice of the higher input impedance provided by a Darlington connection.

Before describing the operation of the improved amplifier in response to differential input signals, it may be helpful to review briefly the level of the static operating currents in each of the amplifiers. The amplifier 7 supplies one-half unit of current and the amplifier 5 supplies one unit of current, causing one-half unit of current to flow in each of the transistors 2 and 3. The amplifier 22 supplies one unit of current to the amplifier 20. The amplifier 35 and the amplifier 31 each supply one-half unit of current to the amplifier 33 for a total of one unit of current.

Operation of the improved amplifier in response to a differential signal is as follows. Assume that the voltage at the terminal 51 goes more positive and the voltage at the input terminal 52 goes more negative. This will cause an increase in the current through the transistor 2 and a decrease in the current through the transistor 3. Since the amplifier 7 provides a constant current, the additional current for the transistor 2 must be drawn from the base of the amplifier 20. This results in an increased output current in the collector electrode of the amplifier 20.

Since the current in the amplifier 22 is constant, the increase in output current from the amplifier 20 must flow into the base electrode of the amplifier 34 to cause an increase in the collector current of the transistor 33 (i.e. the collector current of the transistor 33 is greater than one unit). This additional current in the collector electrode of the transistor 33 is derived from the load circuit (not shown) which must deliver current into the output terminal 38, through the diode 32 into the collector electrode of the amplifier 33. The increased current flowing through the diode 32 causes an increase in the voltage drop across the diode 32 and a decrease in the voltage drop across the base-emitter junction of the amplifier 31, thereby reducing the current flow through the emitter follower amplifier 31. This occurs because the overall voltage drop between the base electrode of the transistor 31 and the collector electrode of the transistor 33 is a constant fixed by the current supplied by the transistor 35 and flowing through diodes 36 and 37, i.e. the sum of the voltage drops across the diodes 36 and 37 is a constant and is equal to the sum of the voltage drops across the diode 32 and the base-emitter junction of the transistor 31. When the voltage drop across the diode 32 increases, the base-emitter voltage drop of transistor 31 must decrease to maintain the equality.

When the input voltage levels at terminals 51 and 52 go more negative and more positive respectively, the current in the transistor 2 decreases and that in the transistor 3 increases. Since the current delivered by the amplifier 7 is constant, the decrease in the current through the transistor 2 causes a corresponding decrease in the base current of the transistor 20. This produces a corresponding decrease in the output collector current of the transistor 20, causing a decrease in the current flowing through the transistor 33. This decreased current in the transistor 33 causes a portion of the emitter current of the transistor 31 to flow from the output terminal 38 into the load circuit. In addition, less current flows in the diode 32 causing a further increase in current delivered by the amplifier 31 to the load.

Note that the output terminal 38 is not referenced to any voltage except by means of the load and/or external D.C. feedback elements to which it is connected. This is important in applications in which reactive loads are driven.

Figure 2:
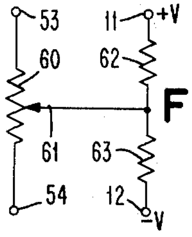
FIG. 2 is a fragmentary, schematic diagram illustrating modification of the embodiment of FIG. 1 for applications where an offset or threshold pedestal is desired.

In the event that a predetermined offset or threshold pedestal is desired, a voltage divider 60 replaces the resistor 10 as seen in FIG. 2. The variable contact portion 61 of the potentiometer is connected to the junction between a pair of resistors 62 and 63 which have their opposite terminals coupled respectively to the positive and negative supply terminals 11 and 12. The values of the resistors 62 and 63 should be set equal to or less than twice the value of the resistor 10 and the value of the resistive element of potentiomter 60 should be made equal to the value of the resistor 10.

Figure 3:
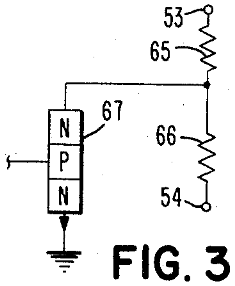
FIG. 3 is a fragmentary, schematic diagram illustrating a modification of the embodiment of FIG. 1 where operation in response to strobe pulses is desired.

In the event that it is desired to utilize the amplifier of FIG. 1 in an environment wherein it is rendered alternatively effective or ineffective in response to input strobe pulses, the embodiment of FIG. 1 is modified as illustrated in FIG. 3. Instead of connecting a single resistor 10 between the terminals 53 and 54, a pair of resistors 65 and 66 equal respectively to one-fourth and three-fourths the value of the resistor 10 are connected. The junction between the resistors 65 and 66 is connected to the collector electrode of a grounded emitter transistor amplifier 67. The base electrode of the transistor amplifier 67 is adapted to be coupled to a source of strobe signals (not shown). When the transistor 67 is nonconducting, the circuit works in the same manner as described with respect to FIG. 1. However, when the transistor 67 is energized to its saturated state, it applies ground potential to the junction between the resistors 65 and 66. Assuming that the volage levels at the terminals 11 and 12 are equal amounts above and below ground potential, the current flowing through the diode 6 is equal to one-third of the sum of the currents flowing through diodes 8 and 9. As a result, the transistor amplifier 7 supplies one-half unit of current while the transistor amplifier 5 supplies only one-third unit of current. As a result, the transistor 2 will carry all of the current from the amplifier 5, even when differential signals are applied to the input terminals.

Figure 4:
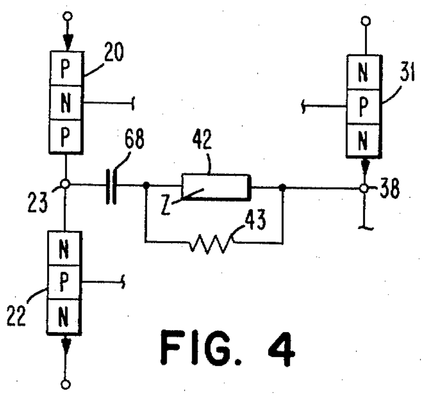
FIG. 4 is a fragmentary, schematic diagram illustrating a modification of the embodiment of FIG. 1.

If the network comprising the impedance 42 and the resistance 43 is coupled to the terminals 23 and 38 by capacitors 68 and 69 as shown in FIG. 4, the collector electrodes of the transistor amplifiers 20 and 22 can be connected directly to each other.

Throughout the application, the statement has been made that each of the diodes in the form of a transistor has its base-collector electrodes short-circuited. By this staement it is meant that the connection between the base and collector electrodes is preferably as low as possible an impedance path. Typically, the lowest impedance path can be made by the conventional metallic conductive pattern formed on the semiconductor chip. It will be appreciated, however, that other techniques might be utilized; for example, resistive diffusions or combinations of resistive underpass diffusions and metallic connections so long as a very low impedance path is assured.

It has been assumed that the combination of one amplifier 5 and one diode 6, together with one amplifier 7 and two diodes 8, 9 and the resistor 10 assures the desired current division in transistors 2, 3. It will be appreciated that the desired division in transistors 2, 3 can also be achieved (as taught in the above said Ordower application) by alternatively providing two parallel-connected amplifiers such as 5 with one diode 6 across their base-emitter electrodes to supply two units of current to the emitter electrodes of the transistors 2, 3 and one amplifier 7 and only one diode 8 to supply one unit of current to the collector electrode of the transistor 2.

The input signal level to the terminals 51 and 52 can vary between +V and three diode voltage drops more positive than −V without causing nonlinearity. The voltage supply difference can be as low as approximately three volts.

In addition, the known process of forming two transistors with a common collector electrode can be used to form diodes 8 and 9 (also transistors 1 and 4 and transistors 34 and 37) since their collector electrodes are connected to the same terminal.

While the invention has been particularly shown and described with reference to preferred embodiments thereof, it will be understood by those skilled in the art that the foregoing and other changes in form and details may be made therein without departing from the spirit and scope of the invention.

I claim:

1. A transistor circuit formed on a single semiconductor chip for amplifying signals applied to input terminals thereof comprising first and second transistors of one conductivity type connected in the form of a differential amplifier having base electrodes coupled to the input terminals, directly connected emitter electrodes and individual collector electrodes, a third transistor of said one conductivity type having a base electrode having an emitter electrode and having a collector electrode connected to the directly connected emitter electrodes to supply operating current to the differential amplifier, a fourth transistor of said one conductivity type having base-emitter voltage-current characteristics substantially matching those of the third transistor, having its base-collector electrodes short-circuited and connected directly to the base electrode of the third transistor, and having its emitter electrode connected directly to the emitter electrode of the third transistor to produce in the collector electrode of the third transistor a current the level of which is substantially equal to that in the collector electrode of said fourth transistor, a fifth transistor of the opposite conductivity type in the form of a common-emitter transistor amplifier having a base electrode, an emitter electrode and a collector electrode connected to the collector electrode of the first transistor to supply operating current thereto, sixth and seventh transistors of said opposite conductivity type having base-emitter voltage-current characteristics substantially matching that of the fifth transistor, having their base-collector electrodes short-circuited and connected directly to the base electrode of the fifth transistor, and having their emitter electrodes connected directly to the emitter electrode of the fifth transistor to produce substantially the same level of collector current in each of the fifth, sixth and seventh transistors, and said third, fourth, fifth, sixth and seventh transistors adapted to supply bias current to operate the first and second transistors as a linear differential amplifier when the emitter electrodes of the third and fourth transistors are coupled to one terminal of a voltage supply, the emitter electrodes of the fifth, sixth and seventh transistors are coupled to another terminal of the voltage supply, the base-collector electrodes of the fourth transistor are connected by a resistor to the base-collector electrodes of the sixth and seventh transistors, and the collector electrode of the second transistor is coupled to said other terminal.

2. The transistor circuit of claim 1 together with an eighth transistor of said opposite conductivity type having its base-collector electrodes short-circuited and connected directly to the collector electrode of the second transistor and adapted to minimize offset errors when its emitter electrode is connected to said other terminal.

3. The transistor circuit of claim 2 together with an output circuit comprising a ninth transistor of said opposite conductivity type having its base electrode connected to the collector electrode of the first transistor, its emitter electrode connected directly to the emitter electrodes of the fifth, sixth, and seventh transistors, and an output collector electrode, and a tenth transistor of said one conductivity type having base-emitter voltage-current characteristics substantially matching those of the fourth transistor and having its base and emitter electrodes connected across the base-collector and emitter electrodes of the fourth transistor and adapted to supply current to the ninth transistor at a level equal to that supplied to the emitter electrodes of the first and second transistors when its collector electrode is coupled to the collector electrode of the ninth transistor.

4. The transistor circuit of claim 3 together with a power output stage having an output terminal and comprising an eleventh transistor of said one conductivity type having a base electrode, a collector electrode connected to the emitter electrodes of the fifth, sixth, seventh and ninth transistors, and an emitter electrode connected to said output terminal, twelfth, thirteenth and fourteenth transistors of said one conductivity type, each having base-emitter voltage-current characteristics substantially matching those of the eleventh transistor and each having its base-collector electrodes short-circuited, an amplifier including a fifteenth transistor having a collector electrode, an emitter electrode connected to the emmiter electrode of the third, fourth and tenth transistors and a base electrode adapted when coupled to the collector electrode of the ninth transistor to receive signals therefrom, the twelfth transistor connecting the emitter electrode of the eleventh transistor to the collector electrode of the fifteenth transistor, a series circuit including the thirteenth and fourteenth transistors being connected between the base electrode of the eleventh transistor and the collector electrode of the fifteenth transistor, and a sixteenth transistor of said opposite conductivity type having base-emitter voltage-current characteristics substantially matching those of the sixth and seventh transistors having its collector electrode connected to the connection between said series circuit and the base electrode of the eleventh transistor, and having its base and emitter electrode adapted when connected across the base-collector and emitter electrodes of the sixth transistor to supply to the thirteenth and fourteenth transistors a bias current substantially equal to the collector current of the sixth transistor.

5. In a signal translating device of the type in which first and second transistors of one conductivity type are connected in the form of a differential amplifier with base electrodes for receiving input signals, with directly connected emitter electrodes and with individual collector electrodes, the combination with the amplifier of a circuit for setting the static operating current levels of the transistors comprising a voltage supply having first and second terminals, a series circuit having impedance means coupled between the first and second terminals of the voltage supply for setting a current level as a function of the values of the impedance means and voltage supply, a third transistor of said one conductivity type with its base-collector electrodes substantially short-circuited and connecting the impedance means to the first terminal, and fourth and fifth parallel-connected matched transistors of the opposite conductivity type with their base-collector electrodes substantially short-circuited and connecting the impedance means to the second terminal to cause the current in each of the parallel transistors to equal substantially one-half of the current in the resistor and third transistor, means coupling to the collector electrode of the second transistor to the second terminal, a first transistor current source having base-emitter voltage-current characteristics substantially matching those of the third transistor, and having its base and emitter electrodes coupled across the base-collector and emitter electrodes of the third transistor to cause their collector currents to be substantially equal, and a second transistor current source, having base-emitter voltage-current characteristics substantially matching those of the fourth and fifth transistors, and having its base and emitter electrodes coupled across the base-collector and emitter electrodes of the fourth and fifth transistors to cause their collector currents to be substantially equal, said first and second transistor current sources respectively coupling the emitter electrodes of the first and second transistors to the first terminal and coupling the collector electrode of the first transistor to the second terminal to produce substantially equal collector operating currents in the first and second transistors.

6. The signal translating device of claim 5 wherein the second-mentioned means comprises an additional transistor having its base-collector electrodes short-circuited and connecting the second terminal to the collector electrode of the second transistor to minimize offset errors.

7. The signal translating device of claim 6 wherein each of the transistors is operated in its linear region.

8. A power amplifier comprising an output load terminal, a voltage supply having first and second terminals at different voltage levels and a third terminal at an intermediate voltage level, a first transistor of one conductivity type having a base electrode, a collector electrode connected to the first voltage supply terminal, and an emitter electrode connected to the load terminal for providing current of one polarity to the load terminal, second, third and fourth transistors of said one conductivity type, each having base-emitter voltage-current characteristics substantially matching those of the first transistor and each having its base-collector electrodes short-circuited, an amplifier including a fifth transistor having a collector electrode, an emitter electrode connected to the second voltage supply terminal, and a base electrode for receiving input signals for application to the output load terminal in amplified form, the second transistor connecting the emitter electrode of the first transistor to the collector electrode of the fifth transistor for providing current of the other polarity to the load terminal, a series circuit including the third and fourth transistors being connected between the base electrode of the first transistor and the collector electrode of the fifth transistor, and means supplying a selected level of current to the third and fourth transistors thereby establishing the static operating current levels of the transistors, causing the current flow in the first and second transistors to be equal when the load current equals zero, and causing the currents in the first and second transistors to vary inversely with respect to each other as input signals are applied to the fifth amplifier.

9. The power amplifier of claim 8 wherein said means comprises a common emitter transistor amplifier of the opposite conductivity type having a base electrode, an emitter electrode connected to the first voltage supply terminal, and a collector electrode connected to said series circuit, a predetermined number of transistors of said opposite conductivity type having base-emitter voltage-current characteristics substantially matching those of the common emitter transistor amplifier and having their base-collector and emitter electrodes directly connected to the base and emitter electrodes of the common emitter transistor amplifier respectively, and means supplying a predetermined current to said predetermined number of transistors to cause the common emitter transistor amplifier to supply said selected level of current to the third and fourth transistors.

10. In a circuit in which a pair of active devices are connected in the form of a differential amplifier with individual input signal electrodes, directly connected second electrodes and individual output electrodes, the combination with the circuit of means for setting the static operating current levels of the devices comprising first and second pluralities of transistors respectively causing a static operating current I to flow in both active devices and a static operating current $I/2$ to flow in one of the active devices thereby to force a static operating current $I/2$ to flow in the other active device, each plurality of transistors characterized by a predetermined number $m$ of common emitter transistor amplifiers, and a predetermined number $n$ of additional transistors having base-emitter voltage-current characteristics which substantially match those of their associated common emitter transistor amplifiers, having their base and collector electrodes short-circuited to operate as diodes and connected directly to the base electrodes of their associated common emitter transistor amplifiers, and having their emitter electrodes connected directly to the emitter electrodes of their associated common emitter transistor amplifiers to produce a total common emitter transistor amplifier collector current approximately equal to $$\frac{m}{n}\times \text{the current through one diode}$$

the fraction $m/n$ of the first plurality of transistors being equal to twice that of the second plurality of transistors, means connecting the active device second electrodes to the collector electrodes of the common emitter transistor amplifiers in the first plurality of transistors, means connecting the output electrode of one active device to the collector electrodes of the common emitter transistor amplifiers in the second plurality of transistors, and means applying a selected level of current to the additional transistors of the first and second pluralities to produce total common emitter transistor amplifier collector currents of I and $I/2$ respectively for application to the active device second and output electrodes.

11. In a circuit in which a plurality $p$ of active semiconductor amplifying devices have first terminals connected to each other and coupled to one terminal of a voltage supply, second terminals for receiving input signals, and third terminals individually coupled to another terminal of the voltage supply, the combination with the circuit of means for setting the static operating current levels of the devices comprising first and second pluralities of transistors respectively causing a value $p\times I$ of current to flow in all active devices and a value I of current to flow in each of the devices except one, thereby to force a value I of current to flow in said one active device, the first plurality of transistors characterized by a predetermined number $m$ of common emitter transistor amplifiers, and a predetermined number $n$ of additional transistors having base-emitter voltage-current characteristics which substantially match those of their associated common emitter transistor amplifiers, having their base and collector electrodes short-circuited to operate as diodes and connected directly to the base electrodes of their associated common emitter transistor amplifiers, and having their emitter electrodes connected directly to the emitter electrodes of their associated common emitter transistor amplifiers to produce a total common emitter transistor amplifier collector current approximately equal to $$\frac{m}{n}\times \text{the current through one diode}$$

the second plurality of transistors characterized by a predetermined number $m$ of common emitter transistor amplifiers in each of $(p-1)$ groups, the collector electrodes of the amplifiers in each group being connected to the third terminal of a respective one of the active semiconductor amplifying devices, and a predetermined number $n$ of additional transistors having base-emitter voltage-current characteristics which substantially matcvh those of the latter common emitter transistor amplifiers, having their base and collector electrodes short-circuited to operate as diodes and connected directly to the base electrodes of the latter common emitter transistor amplifiers, and having their emitter electrodes connected directly to the emitter electrodes of the latter common emitter transistor amplifiers to produce a total common emitter transistor amplifier collector current in each group approximately equal to $$\frac{m}{n}\times \text{the current through one diode}$$

the fraction $m/n$ of the first plurality of transistors being equal to $p$ times that of each group in the second plurality of transistors, and means applying a selected level of current to the additional transistors of the first and second pluralities to produce total common emitter transistor amplifier collector current of $p\times I$ in the first plurality and of I in each group of the second plurality.

References Cited

UNITED STATES PATENTS

| | | | |
|---|---|---|---|
| 3,271,590 | 9/1966 | Sturman | 330—18 X |
| 3,416,092 | 12/1968 | Frederiksen | 330—38 X |

NATHAN KAUFMAN, Primary Examiner

U.S. Cl. X.R.

330—38, 40